United States Patent [19]
Chiou

[11] Patent Number: 5,791,403
[45] Date of Patent: Aug. 11, 1998

[54] CLAMPING DEVICE ADAPTED FOR SECURING A HEAT SINK TO A CPU MOUNT TO HOLD DOWN A CPU

[76] Inventor: Ming Chin Chiou, No. 2, Alley 1, Lane 160, Kai De St., Chien Chen Chu, Kau Hsiung City, Taiwan

[21] Appl. No.: 872,100

[22] Filed: Jun. 10, 1997

[51] Int. Cl.[6] ............................. F28F 7/00; H05K 7/20
[52] U.S. Cl. ................ 165/80.3; 165/185; 174/16.3; 257/719; 361/704
[58] Field of Search ..................... 165/80.3, 185; 174/16.3; 257/718, 719; 361/690, 704, 707, 710

[56] References Cited

U.S. PATENT DOCUMENTS 5,638,258  6/1997  Lin ............................................ 361/704

*Primary Examiner*—Leonard R. Leo
*Attorney, Agent, or Firm*—Bacon & Thomas

[57] ABSTRACT

A clamping device fastened to two triangle blocks at two opposite sides of a CPU mount to hold down a heat sink on a CPU in the CPU mount, including a first clamping plate having a slotted dovetail hung on one triangle block of the CPU mount and two front coupling rods, a second clamping plate attached to the heat sink at the top and having a pair of upright lug at its front end coupled to the coupling rods of the first clamping plate and a downwardly curved front arch extended from its front end and supported between the heat sink and the first clamping plate, and a third clamping plate having a hook in the middle hooked on a coupling hole at the rear end of the second clamping plate a coupling hole at one end coupled to one triangle block of the CPU mount and a finger strip at an opposite end for turning by hand to release the clamping device from the CPU mount.

4 Claims, 5 Drawing Sheets

CLAMPING DEVICE ADAPTED FOR SECURING A HEAT SINK TO A CPU MOUNT TO HOLD DOWN A CPU

BACKGROUND OF THE INVENTION

The present invention relates to a clamping device adapted for securing a CPU mount to hold down a heat sink on a CPU.

When a heat sink is mounted on a CPU mount, it must be firmly retained in place so that heat can be efficiently dissipated from the CPU in the CPU mount into the air through the heat sink. FIG. 1 shows a clamping device adapted for securing to a CPU mount to hold down a heat sink on a CPU. This clamping device is made from a narrow, resilient metal plate having two opposite ends obliquely turned upwards and then terminating in a respective dovetail end piece 11;12 with a respective coupling hole 111;121. When in use, the coupling holes 111;121 of the two dovetail end pieces 11;12 are respectively hung on two triangle blocks at two opposite sides of the CPU mount, and the body of the clamping plate is closely attached to the top side of the heat sink. This structure of clamping device has drawbacks. If the clamping device is vibrated during delivery, the dovetail end pieces of the clamping device tend to be forced away from the triangle blocks of the CPU mount by the spring power of the material property of the clamping device. Further, when to disconnect the clamping device from the CPU mount, a special tool is needed.

SUMMARY OF THE INVENTION

The present invention has been accomplished to provide a CPU heat sink clamping device which eliminates the aforesaid drawbacks. According to one aspect of the present invention, the CPU heat sink clamping device comprises a first clamping plate having a slotted dovetail hung on one triangle block of the CPU mount and two front coupling rods, a second clamping plate attached to the heat sink at the top and having a pair of upright lug at its front end coupled to the coupling rods of the first clamping plate and a downwardly curved front arch extended from its front end and supported between the heat sink and the first clamping plate, and a third clamping plate having a hook in the middle hooked on a coupling hole at the rear end of the second clamping plate a coupling hole at one end coupled to one triangle block of the CPU mount and a finger strip at an opposite end for turning by hand to release the clamping device from the CPU mount. According to another aspect of the present invention, the second clamping plate comprises two horizontal wings respectively inserted into gaps in upright radiating fins of the heat sink, and two vertical wings downwardly raised from two opposite lateral sides and respectively stopped at one side edge of the heat sink.

DETAILED DESCRIPTION OF THE PREFERRED EMBODIMENT

Figure 1:
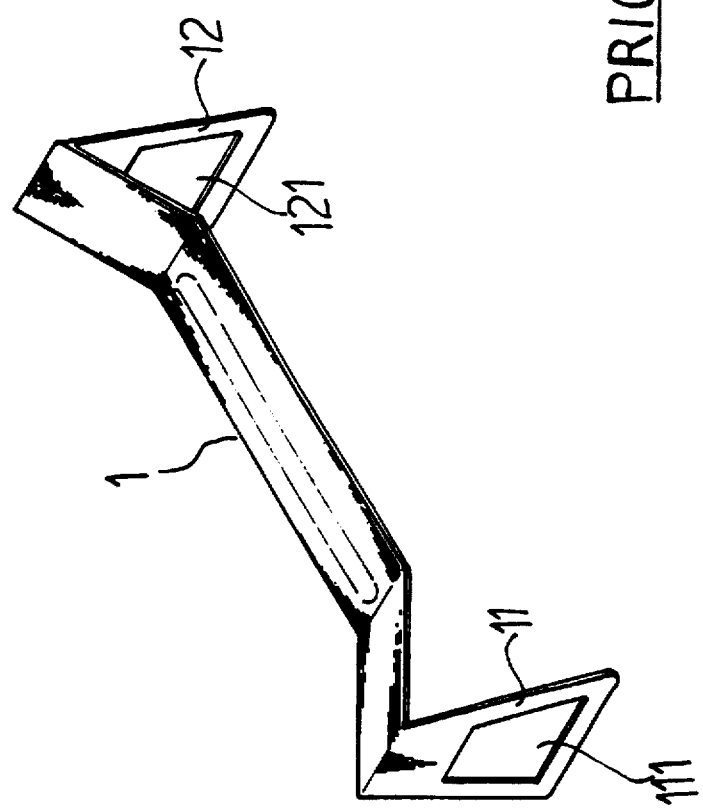
FIG. 1 is an elevational view of a CPU heat sink clamping device according to the prior art.
Figure 2:
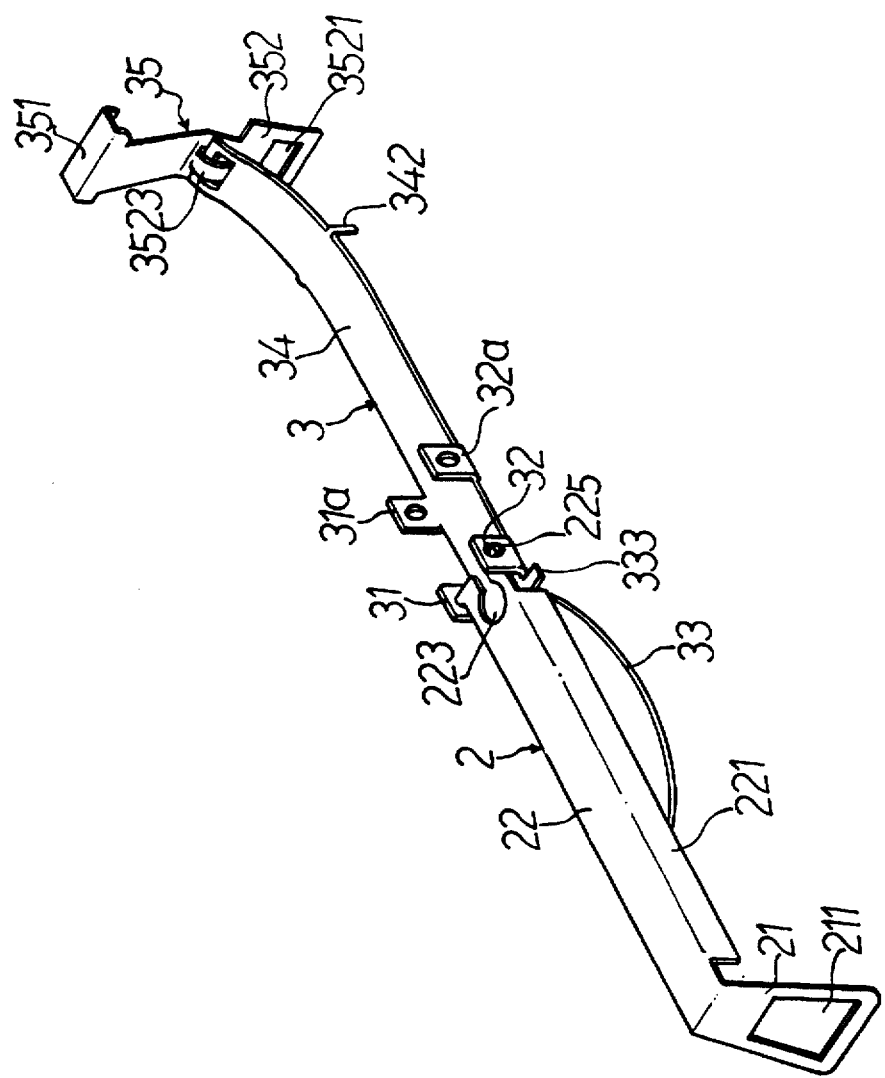
FIG. 2 is an elevational view of a CPU heat sink clamping device according to the present invention.
Figure 3:
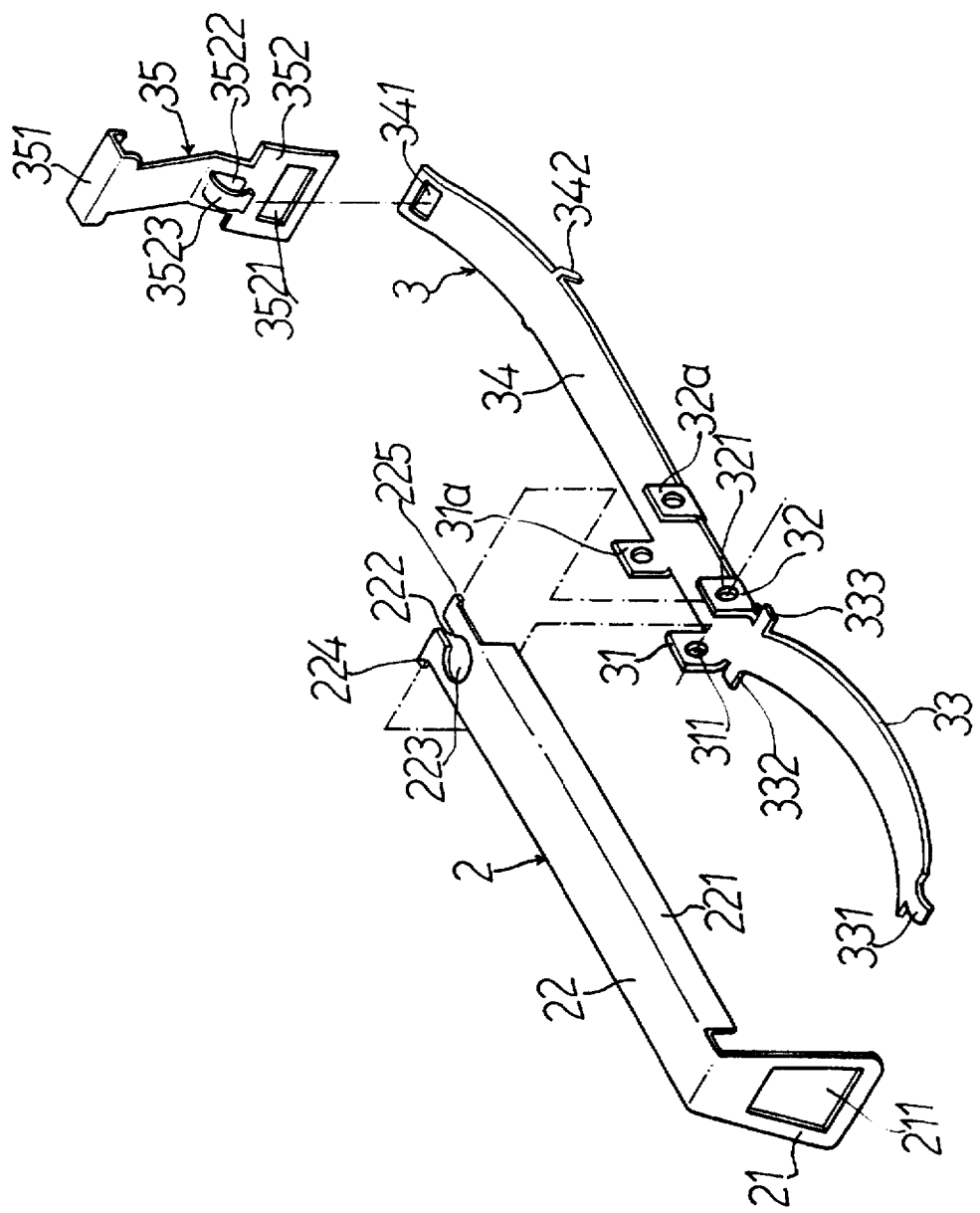
FIG. 3 is an exploded view of the CPU heat sink clamping device shown in FIG. 2.

Referring to FIGS. 2 and 3, a clamping device in accordance with the present invention is comprised of a first clamping plate 2, a second clamping plate 3, and a third clamping plate 35. The first clamping plate 2 comprises an elongated horizontal base 22, two longitudinal flanges 221 respectively and perpendicularly extended from two opposite lateral sides of the elongated horizontal base 22 in one direction, a round hole 223 disposed at one end namely the front end of the elongated horizontal base 22, a longitudinal gap 222 extended from the round hole 223 to the front end of the elongated horizontal base 22, two coupling rods 224;225 bilaterally extended from the front end of the elongated horizontal base 22 and separated by the longitudinal gap 222, a vertical dovetail 21 downwardly extended from one end namely the rear end of the elongated horizontal base 22, and a coupling hole 211 at the vertical dovetail 21. The second clamping plate 3 comprises an elongated horizontal base 34, two horizontal wings 332;333 bilaterally extended from one end namely the front end of the elongated horizontal base 34, pairs of lugs 31;32, 31a;32a raised from two opposite lateral sides of the elongated horizontal base 34 adjacent to the horizontal wings 332;333 and defining a respective hole 311;321, a downwardly curved front arch 33 extended from the front end of the elongated horizontal base 34 and terminating in a tip 331, a coupling hole 341 at one end namely the rear end of the elongated horizontal base 34, and two vertical wings 342 bilaterally and downwardly extended from the elongated horizontal base 34 and spaced between the upright lugs 31a;32a and the coupling hole 341. The rear end of the elongated horizontal base 34 of the second clamping plate 3 curves smoothly upwards. The third camping plate 35 comprises a finger strip 351 of U-shaped cross section at one end, a broad coupling plate 352 at an opposite end, a coupling hole 3521 at the broad coupling plate 352, a punch hole 3522 in the middle, and a hook 3523 raised from one side of the punch hole 3522 and extending toward the broad coupling plate 352. By hooking the hook 3523 of the third clamping plate 35 in the coupling hole 341 of the second clamping plate 3 and forcing the coupling rods 223;225 of the first clamping plate 2 into engagement with the holes 311;321 of one pair of upright lugs 31;32 of the second clamping plate 2, the clamping device is assembled.

Figure 4:
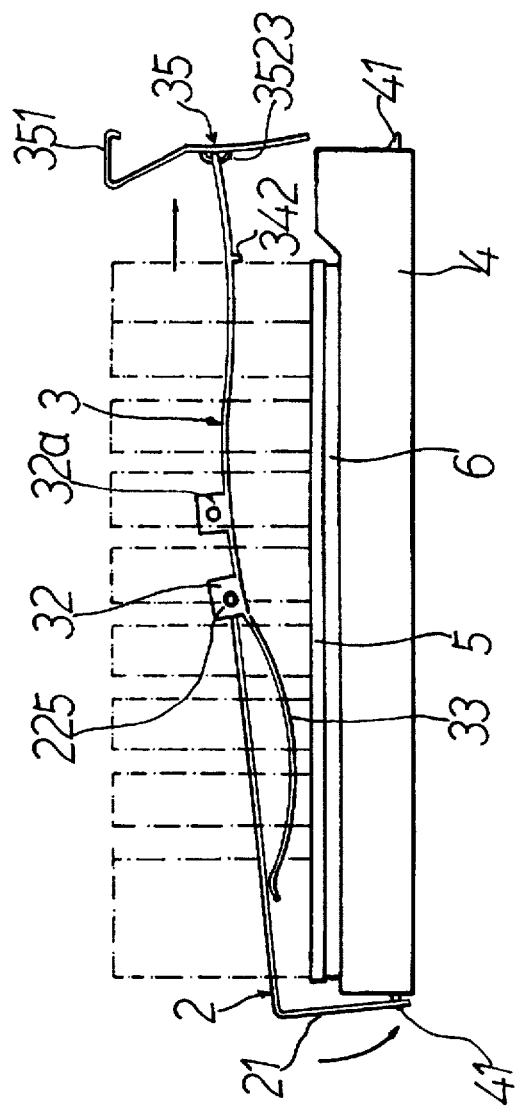
FIG. 4 is an applied view of the present invention, showing the clamping device mounted on the CPU mount.
Figure 5:
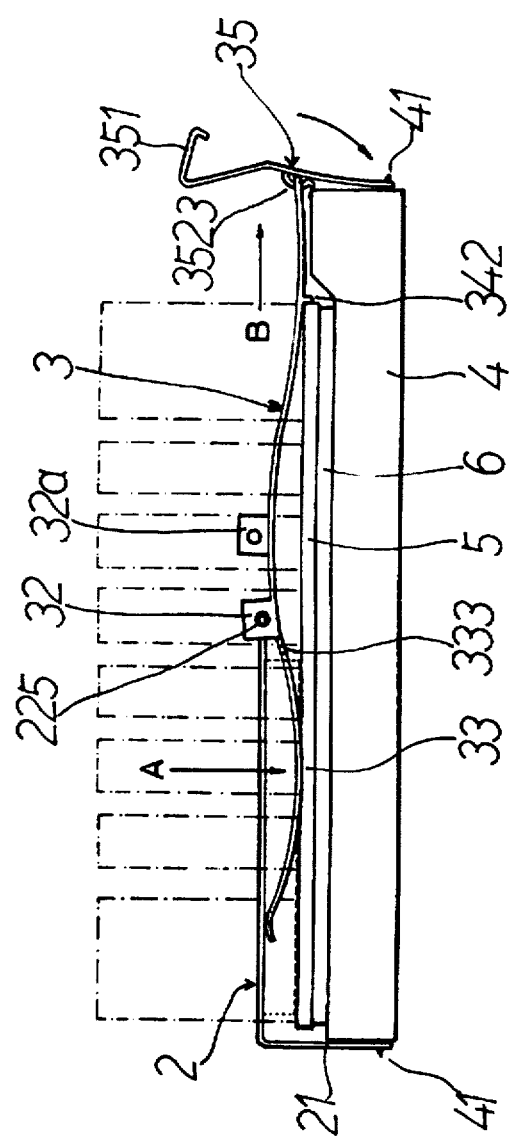
FIG. 5 is similar to FIG. 4 but showing the clamping device installed, the heat sink retained in close contact with the CPU.

Referring to FIGS. 4 and 5, when in use, the coupling hole 211 of the dovetail 21 of the first clamping plate 2 is fastened to one triangle block 41 at one side of the CPU mount 4, permitting the front arch 33 and elongated horizontal base 34 of the second clamping plate 3 to be closely attached to the top surface of the heat sink 5, then the finger strip 351 of the third clamping plate 35 is pulled with the fingers to force the coupling hole 3521 of the broad coupling plate 352 of the third clamping plate 35 into engagement with one triangle block 42 at an opposite side of the CPU mount 4. When the third clamping plate 35 is fastened to the CPU mount 4, it produces a pulling force B to pull the first clamping plate 2 and the second clamping plate 3 forwards, thereby causing the first clamping plate 2 to impart a downward pressure A to the front arch 33 against the heat sink 5, and therefore the heat sink 5 is firmly retained in contact with the CPU 6 in the CPU mount 4. When installed, the longitudinal flanges 221 of the first clamping plate 2 prohibit the front arch 33 of the second clamping plate 3 from sideways displacement; the horizontal wings 332;333 are respectively inserted into gaps in the upright radiating fins of the heat sink 5 and the vertical wings 342 at stopped at one side edge of the heat sink 5 to stop the heat sink 5 in place. Therefore, the heat sink 5 is prohibited from displacement in either direction. Further, by changing the connecting position between the coupling rods 224;225 of the first clamping plate 2 and the upright lugs 31;32,31a;32a of the second clamping plate 3, the total length of the clamping device is adjusted, therefore the clamping device can be adjusted to fit different CPU mounts.

While only one embodiment of the present invention has been shown and described, it will be understood that various modifications and changes could be made thereunto without departing from the spirit and scope of the invention disclosed.

What the invention claimed is:

1. A clamping device fastened to two triangle blocks at two opposite sides of a CPU mount to hold down a heat sink on a CPU in said CPU mount, comprising:

a first clamping plate having an elongated horizontal base attached to said heat sink at a top side, two coupling rods bilaterally extended from one end of the elongated horizontal base and separated by a keyhole-like opening, a vertical dovetail extended from an opposite end of its elongated horizontal base remote from said coupling rods and defining a coupling hole coupled to one of said triangle blocks of said CPU mount;

a second clamping plate coupled to said first clamping plate and closely attached to said heat sink to impart a downward pressure thereon, said second clamping plate comprising an elongated horizontal base closely attached to said heat sink and having a coupling hole at one end and at least one pair of upright lugs at an opposite end for coupling to the coupling rods of said first clamping plate, and a downwardly curved front arch extended from an opposite end of the elongated horizontal base of said second clamping plate and closely attached to said heat sink, said front arch having a front end terminating in a tip for supporting the elongated horizontal base of said first clamping plate; and a third clamping plate secured to the other of said triangle blocks of said CPU mount to hold said one end of said second clamping plate, said third clamping plate comprising a finger strip of U-shaped cross section at one end, a broad coupling plate at an opposite end, a coupling hole disposed at said broad coupling plate and forced into engagement with the other of said triangle blocks of said CPU mount, a punch hole in between said ends, and a hook raised from one side of said punch hole and hooked on the coupling hole of said second clamping plate.

2. The clamping device of claim 1, wherein said first clamping plate comprises two longitudinal flanges perpendicularly raised from two opposite lateral sides of the elongated horizontal base and stopped at two opposite sides of the front arch of said second clamping plate.

3. The clamping device of claim 1, wherein said second clamping plate comprises two horizontal wings bilaterally disposed between said front arch and said at least one pair of upright lugs and respectively inserted into gaps in upright radiating fins of said heat sink.

4. The clamping device of claim 1, wherein said second clamping plate comprises two vertical wings extending upward from two opposite lateral sides of the elongated horizontal base near the coupling hole and stopped at one side edge of said heat sink.

\* \* \* \* \*